US011258395B2

(12) United States Patent
Kumar

(10) Patent No.: US 11,258,395 B2
(45) Date of Patent: Feb. 22, 2022

(54) NEAR CONSTANT DELAY COMPARATOR FOR CLOSED-LOOP SYSTEM

(71) Applicant: Microchip Technology Incorporated, Chandler, AZ (US)

(72) Inventor: Ajay Kumar, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/065,920

(22) Filed: Oct. 8, 2020

(65) Prior Publication Data

US 2021/0320609 A1 Oct. 14, 2021

Related U.S. Application Data

(60) Provisional application No. 63/007,843, filed on Apr. 9, 2020.

(51) Int. Cl.
| | |
|---|---|
| *H02P 29/024* | (2016.01) |
| *H02P 29/032* | (2016.01) |
| *H03K 5/24* | (2006.01) |
| *H03M 1/66* | (2006.01) |
| *H03K 5/00* | (2006.01) |

(52) U.S. Cl.
CPC ........ *H02P 29/027* (2013.01); *H02P 29/0241* (2016.02); *H02P 29/032* (2016.02); *H03K 5/24* (2013.01); *H03K 2005/00058* (2013.01); *H03M 1/66* (2013.01)

(58) Field of Classification Search
CPC .... H02P 29/027; H02P 29/024; H02P 29/032; H02P 29/0241; H03K 5/24
See application file for complete search history.

(56) References Cited

U.S. PATENT DOCUMENTS

| | | | |
|---|---|---|---|
| 9,831,771 B2 * | 11/2017 | Inoue | ........................ H02P 7/29 |
| 10,284,216 B1 | 5/2019 | Chung et al. | |
| 2008/0043391 A1 * | 2/2008 | Wong | ...................... H03F 3/217 |
| | | | 361/59 |

(Continued)

OTHER PUBLICATIONS

Dragan, Anca Mihaela et al., "A Matter Isolation—A Reset Controller Using Deep N-Well and Floating Gate Technologies," 2017 IEEE International Semiconductor Conference, pp. 297-300, Oct. 11, 2017.

(Continued)

*Primary Examiner* — Thai T Dinh
(74) *Attorney, Agent, or Firm* — Slayden Grubert Beard PLLC

(57) ABSTRACT

A voltage comparator and a programmable counter coupled to a high-speed clock are used to provide a near constant delay time for use in a closed-loop system. The voltage comparator input-output time delay is characterized at a certain temperature and operating voltage then variances in the voltage comparator delay times over a range of operating temperatures and voltages are measured and/or extrapolated. A number of clock pulses used for a delay time count are programmed into the programmable counter to provide for a near constant delay time from a change at the input of the voltage comparator to a change at the output of the programmable counter.

14 Claims, 4 Drawing Sheets

(56) References Cited

U.S. PATENT DOCUMENTS

| | | | | |
|---|---|---|---|---|
| 2008/0048598 A1* | 2/2008 | Shibuya | .................... | H02P 6/21 |
| | | | | 318/400.1 |
| 2009/0009117 A1* | 1/2009 | Someya | .................... | H02P 6/08 |
| | | | | 318/400.35 |
| 2009/0135531 A1* | 5/2009 | Hirata | ................. | H02H 7/0838 |
| | | | | 361/18 |
| 2011/0080127 A1* | 4/2011 | Akama | ..................... | H02P 6/06 |
| | | | | 318/400.21 |
| 2011/0188163 A1* | 8/2011 | Ando | ....................... | H03K 5/22 |
| | | | | 361/57 |
| 2012/0249093 A1 | 10/2012 | Grbo et al. | .................... | 323/234 |
| 2013/0043817 A1* | 2/2013 | Shibuya | ................. | H02P 6/182 |
| | | | | 318/400.33 |
| 2013/0121372 A1* | 5/2013 | Wenn | ....................... | G01K 7/22 |
| | | | | 374/102 |
| 2015/0115852 A1* | 4/2015 | Lee | ......................... | H02H 7/09 |
| | | | | 318/400.22 |

OTHER PUBLICATIONS

Wu, Tzu-Fan et al., "A Subranging-Base Nonuniform Sampling ADC with Sampling Event Filtering," IEEE Solid-State Circuits Letters, vol. 1, No. 4, pp. 78-81, Apr. 1, 2018.

International Search Report and Written Opinion, Application No. PCT/US2020/055040, 13 pages, dated Jan. 28, 2021.

* cited by examiner

NEAR CONSTANT DELAY COMPARATOR FOR CLOSED-LOOP SYSTEM

RELATED PATENT APPLICATION

This application claims priority to commonly owned U.S. Provisional Patent Application Ser. No. 63/007,843; filed Apr. 9, 2020; entitled "Near Constant Delay Comparator for Closed-Loop System," and is hereby incorporated by reference herein for all purposes.

TECHNICAL FIELD

The present disclosure relates to closed-loop protection circuits and systems and, more particularly, to closed-loop electric motor protection circuits and systems.

BACKGROUND

In electric motor protection and control system applications, a voltage comparator is often used in over-current/over drive protection circuits wherein motor current is sensed by using a current-to-voltage convertor, e.g., a resistor, that provides a voltage proportional to the motor current and this voltage is coupled to the voltage comparator which compares the sensed motor current (voltage across the resistor) to a voltage reference (voltage threshold). When the motor current exceeds a certain value the comparator output changes logic state and then a motor load reduction or shutdown may occur.

Traditional motor protection and control systems have to trade off reliability for efficiency. A typical voltage comparator (analog device) may have an operating delay variation of plus or minus fifty (50) percent. Therefore, the current sense resistor has to be chosen for a worst case minus fifty (50) percent delay and the electric motor protection system must be able to protect the motor for a worst case plus fifty (50) percent delay. This wide margin results in either an inefficient or over-designed electric motor protection system.

SUMMARY

Therefore, what is needed is a way to minimize the operating delay variation caused by the analog voltage comparator when used in a protection circuit.

According to an embodiment, a comparator having near constant input to output delay time, may comprise: a voltage comparator having a measured delay time between an input change and a subsequent output change at a certain temperature and operating voltage; a programmable delay counter having a first input coupled to an output of the voltage comparator, a second input coupled to a clock generating a plurality of clock pulses, and a third input for programming a count of a number of clock pulses used in determining a time delay of a logic level change at the first input causing a subsequent logic level change at an output thereof, wherein the first input logic level may be delayed by the count of the number of clock pulses programmed into the programmable delay counter via the third input thereof, whereby a total delay from an input of the voltage comparator to the output of the programmable delay counter may be an input-output delay time of the voltage comparator plus a time associated with the count of the number of clock pulses programmed into the programmable delay counter.

According to a further embodiment, a microcontroller may comprise a digital processor and memory coupled to the programmable delay counter, wherein the microcontroller programs the count of the number of clock pulses into the programmable delay counter. According to a further embodiment, a temperature sensor and a voltage sensor in the microcontroller may be provided for measuring temperature and voltage of the voltage comparator, wherein the digital processor and memory adapts the count of the number of clock pulses programmed into the programmable delay counter based upon the measured temperature and voltage. According to a further embodiment, a first input of the voltage comparator may be adapted for coupling to a motor current sensor. According to a further embodiment, the microcontroller may further comprise a digital-to-analog convertor coupled to the digital processor and memory and having an output for providing a reference voltage coupled to a second input of the voltage comparator.

According to another embodiment, a system for electric motor over current protection may comprise: a current sensor coupled to coil of an electric motor for measuring current thereof and having a voltage output proportional to the electric motor current; a voltage comparator having a first input coupled to the current sensor and a second input coupled to a reference voltage, wherein the voltage comparator has a known delay time between an input change and a subsequent output change at a certain temperature and operating voltage, a programmable delay counter having a first input coupled to an output of the voltage comparator, a second input coupled to a clock generating a plurality of clock pulses, and third input for programming a count of a number of clock pulses used in determining a time delay of a logic level change at the first input causing a subsequent logic level change at an output thereof, wherein the first input logic level may be delayed by the count of the number of clock pulses programmed into the programmable delay counter via the third input thereof; and a motor power control circuit having an input coupled to an output of the programmable delay counter, wherein when a voltage from the current sensor may be greater than the reference voltage then the output of the programmable delay counter causes the motor power control circuit to modify operation of the electric motor.

According to a further embodiment, the modify operation of the electric motor may shut down the motor. According to a further embodiment, the modify operation of the electric motor may reduce power used by motor. According to a further embodiment, a microcontroller may comprise a digital processor and memory coupled to the programmable delay counter, whereby the digital processor and memory programs the count of the number of clock pulses into the programmable delay counter. According to a further embodiment, the microcontroller may comprise the voltage comparator and the programmable delay counter. According to a further embodiment, may comprise a temperature sensor and a voltage sensor in the microcontroller for measuring temperature and operating voltage of the voltage comparator, wherein the digital processor and memory adapts the count of the number of clock pulses programmed into the programmable delay counter based upon the measured temperature and voltage.

According to a further embodiment, the microcontroller may comprise a digital-to-analog convertor coupled to the digital processor and having an output for providing the reference voltage to the second input of the voltage comparator. According to a further embodiment, the current sensor may comprise a resistor in series between one electric terminal of a coil of the motor and a power source. According to a further embodiment, wherein the current sensor may comprise a current transformer having a first winding in series between one electric terminal of a coil of the motor and a power source, and a second winding coupled in parallel with a resistor.

According to yet another embodiment, a method for providing near constant input-to-output delay for a comparator may comprise the steps of: providing a voltage comparator having a known time delay between an input change and a subsequent output change at a certain temperature and operating voltage; coupling a programmable delay counter to the voltage comparator; coupling a clock adapted for generating a plurality of clock pulses to the programmable delay counter; and programming a count of a number of clock pulses for determining a time delay of the programmable delay counter, wherein a time delay from the input change to the voltage comparator to a subsequent output change from the programmable delay counter may be the input-output delay time of the voltage comparator plus a time associated with the count of the number of clock pulses programmed into the programmable delay counter.

According to a further embodiment of the method, may comprise the step of modifying the programmed count based upon temperature of the voltage comparator. According to a further embodiment of the method, may comprise the step of modifying the programmed count based upon operating voltage of the voltage comparator. According to a further embodiment of the method, the step of programming the count of the number of clock pulses for determining the time delay of the programmable delay counter may be done with a digital processor and memory.

BRIEF DESCRIPTION OF THE DRAWINGS

A more complete understanding of the present disclosure may be acquired by referring to the following description taken in conjunction with the accompanying drawings wherein.

Figure 1:
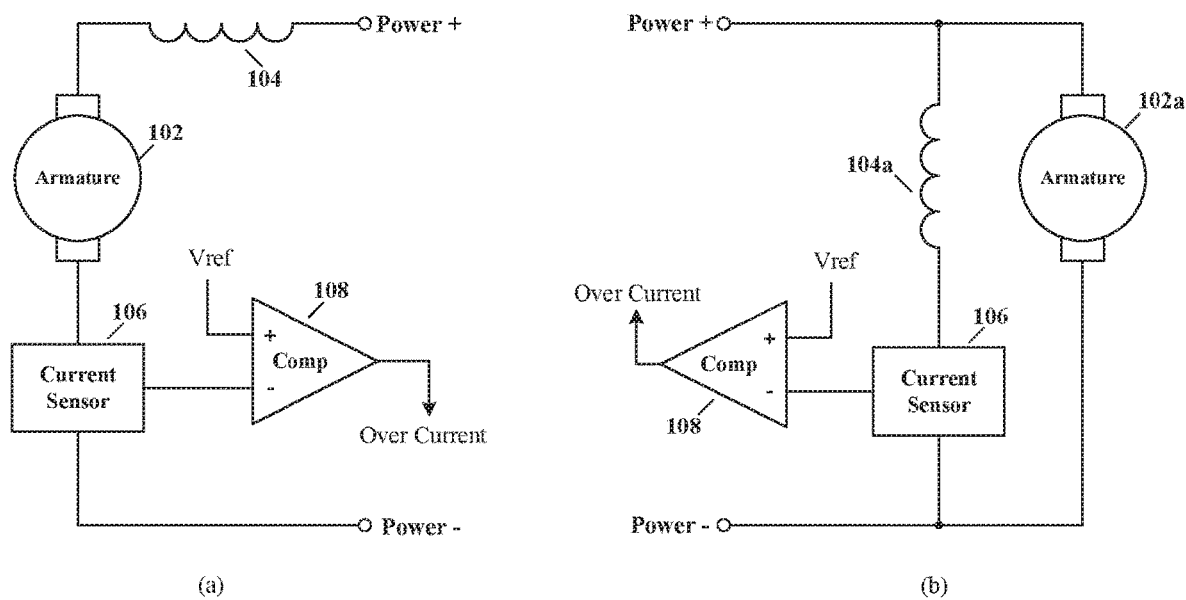
FIG. 1 illustrates schematic block diagrams of overcurrent protection circuits and systems for series and shunt connected motors, according to specific example embodiments of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Motor protection circuits, e.g., over-current protection circuits, use a voltage comparator in combination with a reference voltage, Vref, to detect overcurrent. One input of the voltage comparator is coupled to a current-to-voltage convertor (resistor) whose voltage represents motor current and the other input is coupled to the reference voltage, Vref. When the voltage, representing the motor current, goes from less than to greater than the reference voltage, or vice versa, the logic output of the comparator changes logic state, e.g., 0 to 1 or 1 to 0. However, this output logic state change varies in time depending on the comparator circuit process, voltage and/or temperature (PVT). Therefore, the control loop overload protection actuation time is thereby affected.

A motor can withstand a large overload current for only a short time ($T_{motor\_ovd}$). The control loop overload protection actuation time ($T_{resp\_ovd}$) must be less than $T_{motor\_ovd}$. A fast response from the comparator may be obtained by using a larger voltage, IR drop, across the current sensing resistor (larger resistance value). As used hereinafter, nanosecond is abbreviated as "ns" and millivolt as "mv". For example, at a 200 mv change, the response time of the voltage comparator may be $t_{comp}$=50 ns+/−50%, and for a 20 mv change may be $t_{comp}$=250 ns+/−50%. Thus, the response time for a 200 mv change may be 25 ns to 75 ns (50 ns variation), whereas the response time for a 20 mv change may be 125 ns to 375 ns (250 ns variation).

For a high efficiency motor system with a 20 mv current sensor change, the control loop will compensate for 125 ns voltage comparator response time variation, but there is a risk of protection time variation of 250 ns being greater than $T_{motor\_ovd}$. For a higher protection reliability motor system using a 200 mv current sensor change, the control loop will compensate for 25 ns voltage comparator response time variation. There is a low probability that a protection time variation of 50 ns will be greater than $T_{motor\_ovd}$ and may be up to 200 ns faster than the high efficiency motor system. Unfortunately, the efficiency of the motor system is reduced when using a larger voltage for current sensing. Therefore, the variation in the response time of the voltage comparator may be compensated for so long as the response time, $t_{comp}$, of the voltage comparator is less than the motor overload time, $T_{motor\_ovd}$.

Embodiments of the present disclosure may comprise an analog voltage comparator and a programmable counter coupled to a high-speed clock. The programmable counter may provide an adjustable time delay that may be used to compensate for a variable time delay of the voltage comparator caused by process, voltage and/or temperature (PVT) variations within the voltage comparator circuits. The programmable counter may be programmed based upon process characterization of the voltage comparator delay time, e.g., measured time delay of a production voltage comparator circuit, and changes in this measured voltage comparator delay time based upon changes in the operating temperature and voltage thereof. A baseline process dependent delay time, using a given temperature and voltage, may be determined and then deviations of this baseline process dependent delay time over a range of temperatures and voltages may be determined. Once the voltage comparator delay times have been characterized for all PVT values of operational interest, a lookup table may be defined and correlated with a required additional time delay introduced by the programmable counter. Thus, the resulting compensated comparator delay time ($t_{comp}$+counter delay time) will always be less than the motor overload time, $T_{motor\_ovd}$.

An advantage of the embodiments disclosed herein are near constant comparator delay over temperature and voltage variations. This allows use of a smaller current sense (smaller resistor) value for motor current sensing, thereby lowering power losses and improving motor operating efficiency without sacrificing motor reliability.

Referring now to the drawings, the details of example embodiments are schematically illustrated. Like elements in the drawings will be represented by like numbers, and similar elements will be represented by like numbers with a different lower-case letter suffix.

Referring to FIG. 1, depicted are schematic block diagrams of overcurrent protection circuits and systems for series and shunt connected motors, according to specific example embodiments of this disclosure. FIG. 1(a) depicts a series connected coil 104 and motor armature 102 in combination with a current sensor 106. FIG. 1(b) depicts a parallel connected coil 104 and motor armature 102 in combination with a current sensor 106.

The current sensor 106 produces a voltage may be compared to a reference voltage, Vref, using a voltage comparator 108. When the reference voltage is greater than the voltage from the current sensor 106 the comparator output may be at a logic 1. When the reference voltage is less than the voltage from the current sensor 106 the comparator output may be at a logic 0. The output of the comparator 108 may be used to indicate a motor over current condition as measured through the coil 104/104a.

Figure 2:
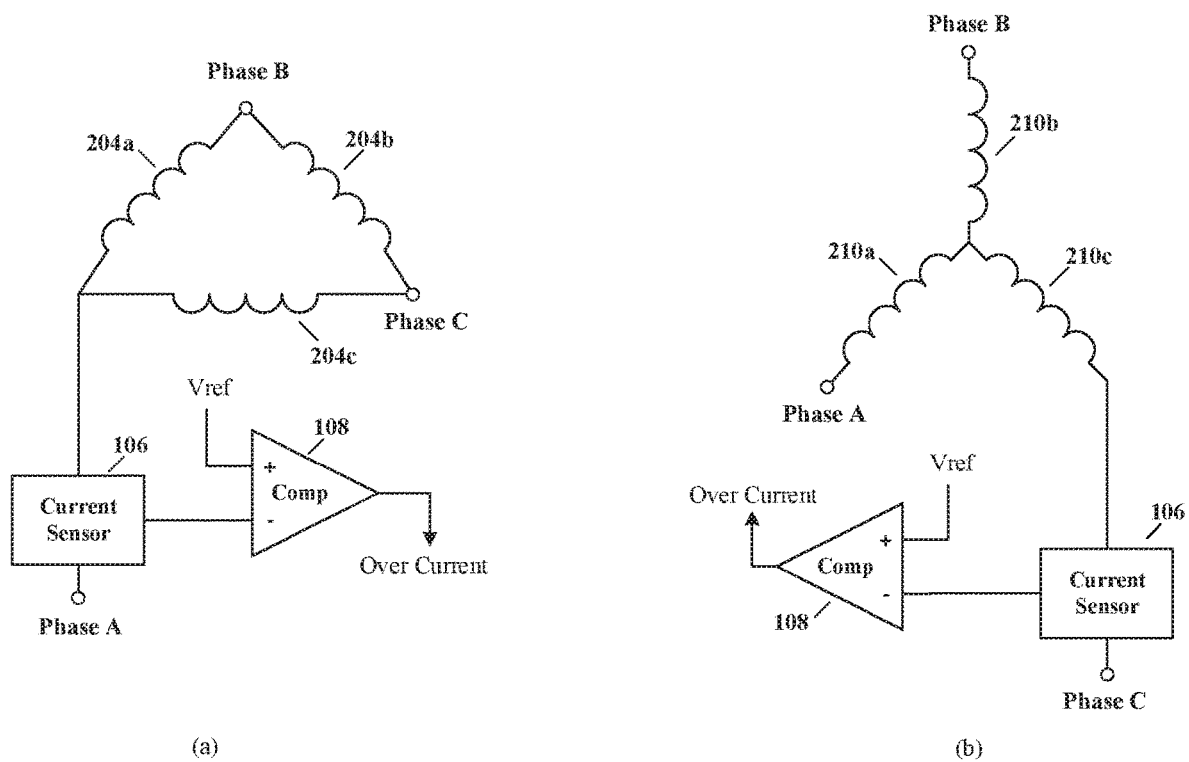
FIG. 2 illustrates schematic block diagrams of overcurrent protection circuits and systems for delta and wye connected three phase motors, according to specific example embodiments of this disclosure.

Referring to FIG. 2, depicted are schematic block diagrams of overcurrent protection circuits and systems for delta and wye connected three phase motors, according to specific example embodiments of this disclosure. FIG. 2(a) depicts a delta connected motor comprising three phase coils 204, respectively shown as coils 204a, 204b and 204c, in combination with a current sensor 106. FIG. 2(b) depicts a wye connected motor comprising three phase coils 210, respectively shown as coils 210a, 210b and 210c, in combination with a current sensor 106.

The current sensor 106 produces a voltage that may be compared to a reference voltage, Vref, using a voltage comparator 108. When the reference voltage is greater than the voltage from the current sensor 106 the comparator output may be at a logic 1. When the reference voltage is less than the voltage from the current sensor 106 the comparator output may be at a logic 0. The output of the comparator 108 may be used to indicate motor over current.

Figure 3:
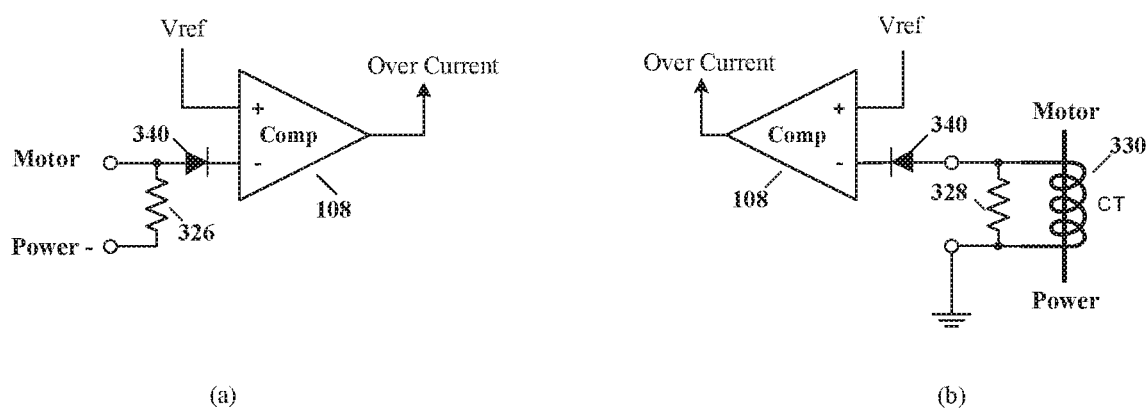
FIG. 3 illustrates schematic diagrams of a current sensors that may be used in the circuits shown in FIGS. 1, 2 and 4, according to the teachings of this disclosure.
Figure 4:
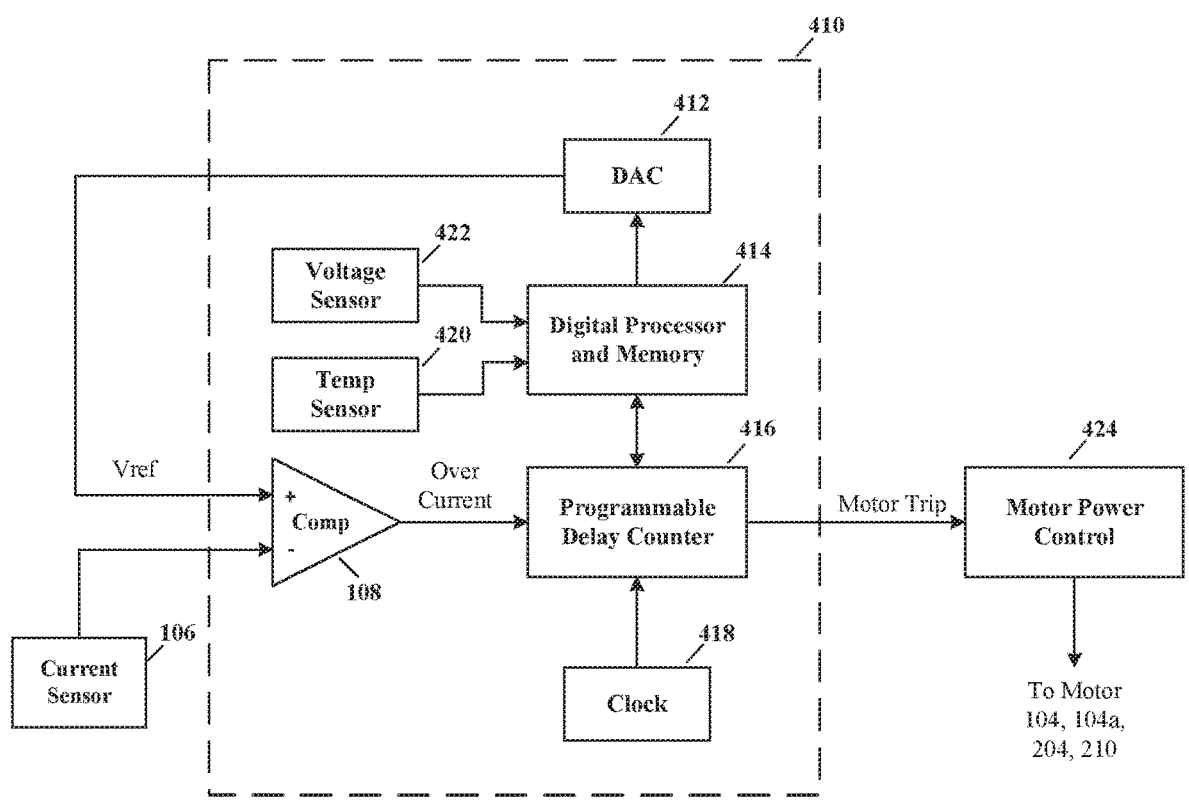
FIG. 4 illustrates a schematic block diagram of a microcontroller implementation for the overcurrent protection circuits shown in FIGS. 1 and 2, according to specific example embodiments of this disclosure.

Referring to FIG. 3, depicted are schematic diagrams of current sensors that may be used in the circuits shown in FIGS. 1, 2 and 4, according to the teachings of this disclosure. FIG. 3(a) shows a resistor 326 wherein the motor current passes directly through. The voltage drop across the resistor 326 is proportional to the motor current. The voltage at the motor side of the resistor 326 is compared to the reference voltage, Vref, and when greater than Vref the output of the comparator 108 may be at a logic 0. FIG. 3(b) shows a resistor 328 in parallel with a winding of a current transformer (CT) 330. Diode 340 is for converting AC voltage to DC voltage, a smoothing capacitor is not shown but would also be used in converting AC to DC voltage. When a power supply lead from the power source to the motor passes through the CT 330, the current flowing through the power lead is stepped down in proportion to the turns-ratio of the CT 330 to the power lead passing through to the motor. The winding of the CT 330 in combination with the resistor 328 produces a voltage proportional to the motor current divided by the CT 330 turns ratio. The voltage from the resistor 328 is compared to the reference voltage, Vref, and when greater than Vref the output of the comparator 108 may be at a logic 0. The output of the comparator 108 may be used to indicate over current.

Referring to FIG. 4, depicted is a schematic block diagram of a microcontroller implementation for the overcurrent protection circuits shown in FIGS. 1 and 2, according to specific example embodiments of this disclosure. A microcontroller 410 may comprise a comparator 108, a digital-to-analog convertor (DAC) 412, a digital processor and memory 414, a programmable delay counter 416, and a clock 418. A first input of the comparator 108 may be coupled to the current sensor 106 and a second input coupled to an output of the DAC 412. The DAC 412 may be used to provide a reference voltage, Vref, programmable from the digital processor and memory 414. The output from the programmable delay counter 416 may be coupled to a motor power control 424 for shutting down and/or reducing power used by the coil 104, 104a, 204, 210 of a target motor. The programmable delay counter 416 may be programmed with a count, n, so that an input logic level change at its input (coupled to the output of the comparator 108), indicative of over current, may be delayed by n clock pulses (clock pulses from the clock 418). The delayed output from the programmable delay counter 416 may be coupled to the motor power control 424 as a motor trip signal. A temperature sensor 420 and a voltage sensor 422 may be provided in the microcontroller 410 for measuring temperature and voltage of the comparator 108. Analog-to-digital convertors (not shown) may also be provided between these sensors and the digital processor and memory 414 if the temperature sensor 420 and the voltage sensor 422 have analog and not digital outputs.

The count, n, may be used to characterize the time delay of the voltage comparator 108 under test while it is operating at a certain temperature and voltage. Then extrapolative testing of the time delay of the voltage comparator 108 over an operating range of temperatures and operating voltages may also be performed. Temperature and voltage changes may be determined on how they affect the time delay of the voltage comparator 108 under test. The measured time delay, and how it varies with temperature and voltage may be stored in the memory of the digital processor 414. During operation of the microcontroller 410 the temperature sensor 420 and voltage sensor 422 may be used to provide temperature and voltage values that may be used for looking up corresponding temperature and voltage variation tables and/or may be extrapolated on how the time delay of the comparator 108 may be affected. This provides a more precise fixed time delay over a voltage comparator circuit process, voltage and/or temperature (PVT) variations.

For example, process delay may vary +/−35%, and temperature caused delay +/−15%. To provide a fixed 400 ns comparator output logic change of signal motor trip in response to an output of current sensor 106 crossing Vref, and assuming a 6 ns clock time, Typical comparator delay 250 ns+counter 150 ns=400 ns, 25 clocks to counter Slow comparator delay 330 ns+counter 70 ns=400 ns, 12 clocks to counter Fast comparator delay 170 ns+counter 230 ns, 38 clocks to counter Trim temperature delay may be adjusted:
  Room temperature delay count=25 clocks
  Cold temperature delay count=28 clocks
  Hot temperature delay count=22 clocks The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A microcontroller comprising:
 a voltage comparator having a measured delay time between an input change and a subsequent output change at a certain temperature and operating voltage;
 a programmable delay counter having a first input coupled to an output of the voltage comparator, a second input coupled to a clock generating a plurality of clock pulses, and a third input for programming a count of a number of clock pulses used in determining a time delay of a logic level change at the first input causing a subsequent logic level change at an output thereof, wherein the first input logic level is delayed by the count of the number of clock pulses programmed into the programmable delay counter via the third input thereof, whereby a total delay from an input of the voltage comparator to the output of the programmable delay counter is an input-output delay time of the voltage comparator plus a time associated with the count of the number of clock pulses programmed into the programmable delay counter,
 a digital processor and memory coupled to the programmable delay counter, wherein the digital processor programs the count of the number of clock pulses into the programmable delay counter, and
 a temperature sensor and a voltage sensor for measuring temperature and voltage of the voltage comparator, wherein the digital processor and memory adapts the count of the number of clock pulses programmed into the programmable delay counter based upon the measured temperature and voltage.

2. The microcontroller according to claim 1, further comprising a first input of the voltage comparator adapted for coupling to a motor current sensor.

3. The microcontroller according to claim 2, wherein the microcontroller further comprises a digital-to-analog convertor coupled to the digital processor and memory and having an output for providing a reference voltage coupled to a second input of the voltage comparator.

4. A system for electric motor over current protection, said system comprising:
 a current sensor coupled to coil of an electric motor for measuring current thereof and having a voltage output proportional to the electric motor current;
 a voltage comparator having a first input coupled to the current sensor and a second input coupled to a reference voltage, wherein the voltage comparator has a known delay time between an input change and a subsequent output change at a certain temperature and operating voltage,
 a programmable delay counter having
  a first input coupled to an output of the voltage comparator,
  a second input coupled to a clock generating a plurality of clock pulses, and
  third input for programming a count of a number of clock pulses used in determining a time delay of a logic level change at the first input causing a subsequent logic level change at an output thereof, wherein the first input logic level is delayed by the count of the number of clock pulses programmed into the programmable delay counter via the third input thereof; and
 a motor power control circuit having an input coupled to an output of the programmable delay counter, wherein when a voltage from the current sensor is greater than the reference voltage then the output of the programmable delay counter causes the motor power control circuit to modify operation of the electric motor.

5. The system according to claim 4, wherein the modify operation of the electric motor is shutting down the motor.

6. The system according to claim 4, wherein the modify operation of the electric motor is reducing power used by motor.

7. The system according to claim 4, wherein a microcontroller comprises a digital processor and memory coupled to the programmable delay counter, whereby the digital processor and memory programs the count of the number of clock pulses into the programmable delay counter.

8. The system according to claim 7, wherein the microcontroller further comprises the voltage comparator and the programmable delay counter.

9. The system according to claim 8, further comprising a temperature sensor and a voltage sensor in the microcontroller for measuring temperature and operating voltage of the voltage comparator, wherein the digital processor and memory adapts the count of the number of clock pulses programmed into the programmable delay counter based upon the measured temperature and voltage.

10. The system according to claim 8, wherein the microcontroller further comprises a digital-to-analog convertor coupled to the digital processor and having an output for providing the reference voltage to the second input of the voltage comparator.

11. The system according to claim 4, wherein the current sensor comprises a resistor in series between one electric terminal of a coil of the motor and a power source.

12. The system according to claim 4, wherein the current sensor comprises a current transformer having a first winding in series between one electric terminal of a coil of the motor and a power source, and a second winding coupled in parallel with a resistor.

13. A method for providing near constant input-to-output delay for a comparator, said method comprising the steps of:
 providing a voltage comparator having a known time delay between an input change and a subsequent output change at a certain temperature and operating voltage;
 coupling a programmable delay counter to the voltage comparator;
 coupling a clock adapted for generating a plurality of clock pulses to the programmable delay counter;
 measuring temperature and voltage of the voltage comparator; and
 programming a count of a number of clock pulses for determining a time delay of the programmable delay counter based upon the measured temperature and voltage, wherein a time delay from the input change to the voltage comparator to a subsequent output change from the programmable delay counter is the input-output delay time of the voltage comparator plus a time associated with the count of the number of clock pulses programmed into the programmable delay counter.

14. The method according to claim 13, wherein the step of programming the count of the number of clock pulses for determining the time delay of the programmable delay counter is done with a digital processor and memory.

* * * * *